United States Patent Office

3,558,609

Patented Jan. 26, 1971

3,558,609

AZIDO AZOMETHINES FOR REPROGRAPHIC COPYING COMPOSITIONS

Hans Ruckert, Wiesbaden-Schierstein, Germany, assignor to Kalle Aktiengesellschaft, Wiesbaden-Biebrich, Germany No Drawing. Filed Mar. 10, 1967, Ser. No. 622,096
Claims priority, application Germany, Mar. 12, 1966, K 58,704
Int. Cl. C09b *23/00;* C07d *109/00;* G03c *1/52*
U.S. Cl. 260—240 10 Claims

ABSTRACT OF THE DISCLOSURE

This invention relates to novel azido azomethines, to a reprographic copying composition containing such azido azomethines, and to a process for making a printing plate from a supported light-sensitive layer containing such azido azomethines.

The present invention relates to a reprographic copying composition and a reprographic copying material prepared therewith, the copying composition containing, in known manner, a resin which is insoluble in water but soluble in organic solvents and in alkaline aqueous solutions, and a water-insoluble, light-sensitive aryl azide which is homogeneously distributed in the resin. The light-sensitive aryl azide is an azido azomethine and corresponds to one of the following general Formulae I and II:

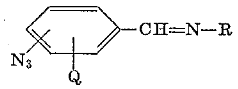

(I)

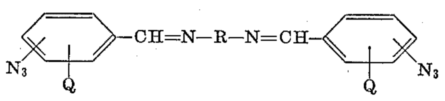

(II)

wherein:

Q is selected from the group consisting of hydrogen, hydroxyl, alkyl, alkoxy, dialkylamino, and azido groups,
R is an isocyclic aromatic or a heterocyclic aromatic group or a substituted isocyclic or heterocyclic aromatic group, and the
$N_3$-groups are in meta or para position to the group CH=N—R.

Organic azido compounds, primarily aromatic azides, are among the light-sensitive compounds which are of practical interest for the graphic reproduction arts, particularly for reproduction by means of printing forms, e.g. for planographic or intaglio or relief printing. In a number of patent specifications, e.g., German Pats. Nos. 752,852, and 929,460, processes have been described in which reproduction layers are used with aromatic azido compounds as the light-sensitive substances, frequently in combination with synthetic or natural substances which undergo hardening under certain conditions.

In some of the known processes, the aromatic azides are employed in the water-soluble form, which requires the presence of water-soluble groups in the molecule of the azido compound used. In other processes, the aromatic azides are used in organic solvent solutions. When a layer containing an aromatic azide is exposed to actinic light, the azide is converted by the action of light. The light-conversion products are distinguished from the unexposed azido compound by a change of color and, in the presence of hardenable substances, by a hardening or tanning of such hardenable substances, which leads to a change in their solubility characteristics. Reproduction layers containing aromatic azido compounds are negative-working. Upon image-wise exposure of the layer containing the azido compound under a transparent original, an image is obtained in the reproduction layer, which image is produced by the light-conversion products of the azido compound and has reversed tone values with respect to the original.

Many of the aromatic azido compounds suitable as light-sensitive substances for reproduction processes belong to the group of azido styryls.

The use of aromatic azido compounds as effective substances in light-sensitive reproduction layers is of particular practical interest because of the formation of colored conversion products in such areas of the reproduction layer as have been affected by light.

The light-sensitive reproduction material of the invention consists of a support suitable for reprographic purposes and a reproduction layer of the above-described composition adhering thereto.

The aromatic groups represented by R in the general Formulae I and II above may be those which contain a benzene nucleus, a naphthalene nucleus, or a pyridine nucleus. Hydroxyl, alkyl, alkoxy, dialkylamino and azido groups are exemplary of the substituents Q in the general Formulae I and II and the substituents which may be attached to the aromatic groups R.

The azido azomethines corresponding to the general Formulae I and II have not been previously described in the literature. They may be prepared by analogy to known processes. The azido azomethines corresponding to Formulae I and II are prepared by a smooth reaction in which aromatic azido aldehydes are reacted in known manner with aromatic amines, the reaction being performed, if desired, with the addition of alkaline condensing agents, e.g. piperidine. For this purpose, equimolecular quantities of the two reactants are dissolved in an organic solvent, such as ethanol. The reaction proceeds at normal or slightly elevated temperatures. In most cases, the azido azomethine crystallizes within a short time at a high yield and with satisfactory purity.

The formulae of some exemplary azido azomethines useful in the reprographic copying composition and copying material of the invention are listed below, by way of example, under consecutive numbers. Insofar as their melting or decomposition points and their absorption maxima, λ max., cannot be taken from the following examples, they are listed below as follows:

| Formula Number | Melting point (° C.) | λ max., nm. | Formula Number | Melting point (° C.) | λ max., nm. |
|---|---|---|---|---|---|
| 1 | 52-55 | 297 | 15 | 74 | 372 |
| 2 | 58-59 | 300 | 16 | 106 | 353 |
| 3 | 75-77 | 292 | 17 | 170 | 340 |
| 4 | 66-68 | 300 | 19 | 146-147 | 370 |
| 6 | >250 | 386 | 20 | 121-123 | 370 |
| 7 | 171-172 | 364 | 22 | 80-82 | — |
| 10 | >250 | 363 | 24 | — | 365 |
| 11 | 160 | 347 | 26 | 170-171 | 380 |
| 12 | 119-120 | 345 | 28 | 280 | 373 |
| 13 | 83-84 | 401 | 29 | 260 | 322 |

FORMULAE 1 THROUGH 29

(1)

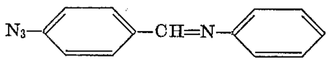

(2)

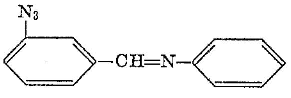

(3)

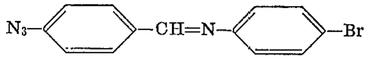

(4)

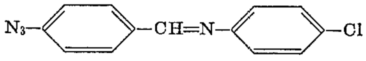

(5)
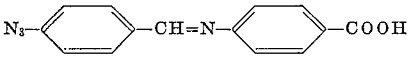

(6)
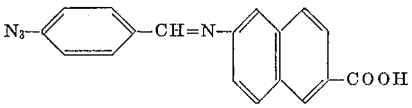

(7)
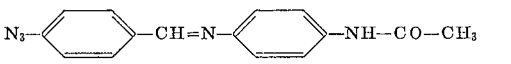

(8)
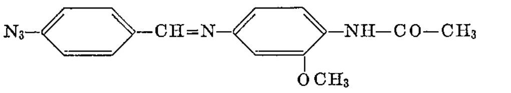

(9)
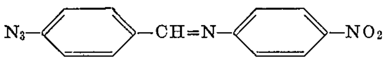

(10)
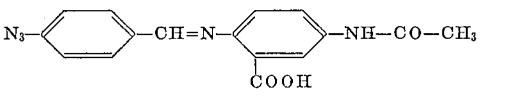

(11)
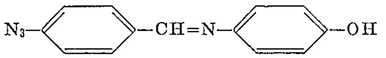

(12)
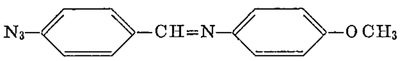

(13)
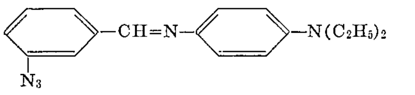

(14)
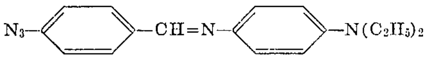

(15)
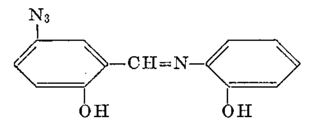

(16)
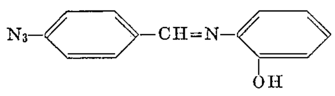

(17)
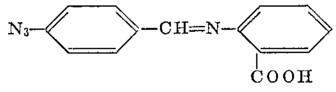

(18)
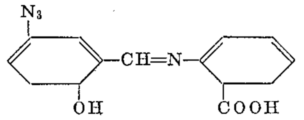

(19)
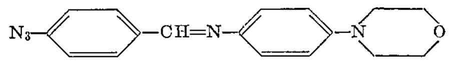

(20)
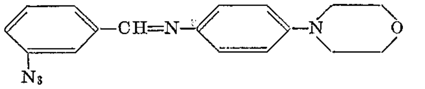

(21)
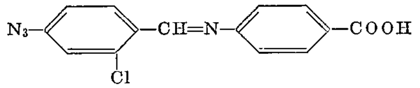

(22)
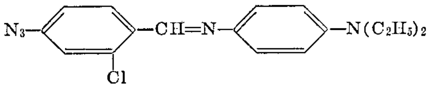

(23)
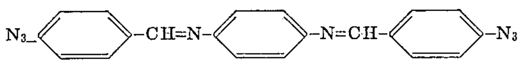

(24)
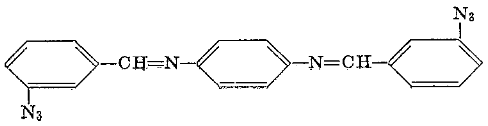

(25)
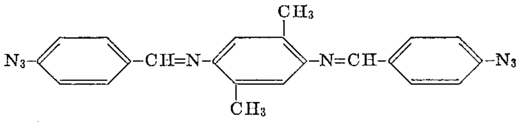

(26)
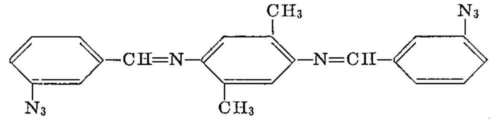

(27)
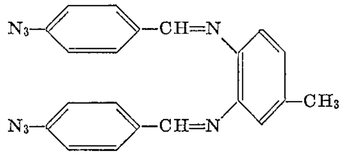

(28)
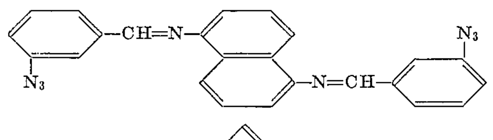

(29)
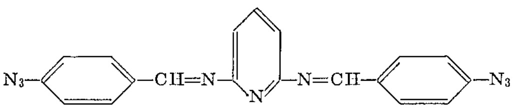

The light-sensitive copying compositions according to the present invention are prepared from one or more azido azomethines corresponding to Formulae I and II above, if desired in admixture with aryl azides of a different constitution or with other negative-working light-sensitive substances, and resins which are soluble in organic solvents and soluble or swellable in an aqueous alkaline medium. Resins of this type are, e.g.: copolymers of styrene and maleic anhydride, or copolymers of vinyl acetate and crotonic acid, polycondensates of the novolak type prepared from formaldehyde and phenols, or phenol-formaldehyde resins which have been modified by treatment with chloroacetic acid. Generally speaking, those resins are suitable which are soluble at 20° C. to at least 3 percent by weight in glycol monomethyl ether, glycol monoethyl ether, glycol monoethylether acetate, or dimethyl formamide, and which are soluble or swellable at 20° C. in a 3 percent aqueous sodium hydroxide solution to such an extent that a dry layer of the resin adhering to a mechanically roughened aluminum support can be wiped off the aluminum support by swabbing with a 3 percent aqueous sodium hydroxide solution.

In order to increase the film-forming capacity of the light-sensitive reproduction composition of the invention and to improve also its resistance to the etching solutions which may be used in one of the etching processes customary in some cases in chemigraphy, it may be advantageous to add other resins, i.e. resins which are insoluble and unswellable in aqueous alkaline solutions and which come under the designation "synthetic lacquer resins." Polyvinyl acetates, the copolymers thereof and rubber resins have proved particularly suitable for this purpose. In some cases, it also may be advantageous to add a plasticizer. The total quantity by weight of resins which are not soluble or swellable in aqueous alkaline solutions and of plasticizer should not exceed the quantity of the resin which is soluble or swellable in aqueous alkaline solutions.

Depending upon the desired properties of the printing form and the appropriate developer used, the proportions of the azido azomethine according to one of the general formulae above and the resins, including plasticizer, may vary within wide limits. Good results are achieved with proportions, by weight, ranging from 2:1 to 1:10, preferably from 1:1 to 1:5. Within the above limits, the proportions are also determined by the intended use of the light-sensitive reproduction material and by the properties of the developer employed for conversion of the reproduction material into a printing form.

For the preparation of the light-sensitive reproduction material of the invention, comprising a conventional support suitable for reprographic purposes and a layer adhering thereto of the light-sensitive reproduction composition according to the invention, the reproduction composition is dissolved in an organic solvent and applied to the support; the applied solution is then dried. Suitable solvents for the preparation of the coating solutions are, for example, esters, such as butyl acetate; ketones, such as methylisobutyl ketone and cyclohexanone; ethers, such as diisopropyl ether and dioxane; alcohols, such as n-butanol; diolethers, such as glycol monoethylether; acid amides, such as dimethyl formamide, and mixtures of such solvents.

The support consists of a plastic film or paper or optionally of pretreated plates or foils of the metals usually employed for printing forms, such as zinc, magnesium, aluminum, chromium, brass, and steel, as well as bimetal and trimetal plates. The support is coated with the solution of the reproduction composition of the invention by one of the customary coating techniques, e.g. by whirl-coating, spraying, immersion, roller application, or by applying a film of a liquid.

The reproduction composition may be colored or the reproduction layer may be colored after application to the support and drying. Using a colored layer is recommended in most cases, mainly because it facilitates the evaluation of the development and of the tone values obtained in the case of half-tones. If the printing plates prepared from the reproduction material are to be etched, dyestuffs preferably are selected with which the risk of a reductive discoloration in the etching bath is small, e.g. dyestuffs of the phthalocyanine type and metal complex dyestuffs.

Processing of the reproduction material of the invention into a printing form, preferably a printing plate, is performed in the conventional manner. The material is exposed under a negative original to a light source emitting rays in the ultra-violet range of the spectrum, i.e. actinic rays. Whereas the resin component of the reproduction layer is cross-linked in the light-struck areas and thus hardened, the unexposed portions of the layer, which retain their solubility, are removed by immersion and/or swabbing with an organic solvent, or, preferably, with an aqueous alkaline developer. The developer also may contain salts, e.g. halides, phosphates, silicates or sulfates of alkali and alkaline earth metals, and quaternary ammonium bases, e.g. reaction products of amines and ethylene oxide, as well as organic solvents, or mixtures thereof.

In some cases, particularly when masking and correcting work is to be done, it may be of advantage to render the layer more resistant by burning it in before the development or etching step. The light-sensitive reproduction layers of the invention are distinguished in that the burning-in operation can be performed not only after exposure to light and subsequent development, but also immediately after exposure and before development. By means of a more alkaline or more concentrated developer of the above composition, the layer is removed after burning-in from the areas not struck by light during exposure, whereas the light-struck areas of the layer have become more resistant to the developer by the burning-in step.

Planographic printing plates produced from the light-sensitive reproduction material of the invention are inked up with greasy ink in the conventional manner after development. In the case of bimetal or trimetal plates or of relief and intaglio printing plates or cylinders, the layer-free areas of the printing forms are deep-etched by means of specific etching solutions, a protective medium for the side walls being added in the case of zinc and magnesium etching plates which are to be etched with nitric acid in one-step etching machines.

The light-sensitive reproduction composition of the invention and the light-sensitive reproduction material of the invention are distinguished by good light-sensitivity combined with good stability. The shelf-life of the reproduction material of the invention is exceptional. The reproduction material has the further advantage that the image is distinctly visible immediately after exposure to light. It thus combines the qualities always required, but by no means always present, of an ideal light-sensitive reproduction material, viz good adhesion between the support and the light-sensitive layer, good light-sensitivity, good shelf-life, immediate visibility of the printing image after exposure to light, good affinity for greasy inks, and good mechanical resistance of the printing image and chemical resistance against attack during the etching process.

As a specific property of the azido azomethines, it must be emphasized that they form a comparatively large quantity of dyestuff during exposure, due to their phototropic characteristics. This means that images rich in contrast are formed by exposure; azido azomethines carrying basic substituents exhibit the strongest dyestuff formation.

In the following examples, the relation between parts by weight and parts by volume is the same as that between grams and milliliters. nm. stands for nanometer, 1 nm.=1 mμ or 10 A. Percentages are by weight.

EXAMPLE 1

1 part by weight of the compound of Formula 5 and 3 parts by weight of a meta cresol-formaldehyde novolak are dissolved in 100 parts by volume of glycol monoethylether. A mechanically roughened aluminum foil is whirl-coated with this solution and then dried, first by means of warm air and then for 2 minutes at 100° C. The light-sensitive coated foil is exposed under a negative master to a light source emitting a large proportion of ultra-violet rays, e.g. a carbon arc lamp or a tubular exposure lamp. By wiping the exposed layer with an approximately 10 percent aqueous solution of trisodium phosphate, the areas of the layer which were not affected by light are removed. After inking with greasy ink, the aluminum foil may be used as a planographic printing plate for printing.

The compound of Formula 5 is prepared by combining equimolecular quantities of 4-azido-benzaldehyde and 4-amino benzoic acid dissolved in hot ethanol. The condensation product which precipitates is recrystallized from ethanol. Its melting point is 168° C.; the absorption maximum, λmax., is 314 nm.

EXAMPLE 2

2 parts by weight of the compound of Formula 14 above and 1 part by weight of meta cresol-formaldehyde novolak are dissolved in 100 parts by volume of glycol ethylether acetate. A mechanically roughened aluminum foil is coated with this solution, as described in Example 1, and the coated layer is dried. An offset printing plate is then prepared in the manner described in Example 1. The developer used for the foil, after exposure under a master, is a dilute aqueous solution of a quaternary ammonium base prepared by reaction of an aliphatic amine with ethylene oxide, the solution containing 1 part by weight of ammonium base in 20 parts by volume of water.

The compound of Formula 14 is prepared by condensing 4-azidobenzaldehyde with freshly distilled 4-diethylamino aniline in hot ethanol. The melting point of the compound is 73–75° C., its absorption maximum, λ max., is 405 nm.

EXAMPLE 3

1 part by weight of the compound of Formula 8 above and 1 part by weight of a condensation product of meta cresol-formaldehyde novolak and monochloroacetic acid are dissolved in 100 parts by volume of glycol monomethylether. A trimetal plate consisting of layers of aluminum, copper and chromium is coated with this solution and then dried. For the preparation of a positive printing plate capable of long runs, the coated and dried plate is exposed under a positive master and then developed with a 5 percent trisodium phosphate solution which also contains 5 percent of diethylene glycol monoethylether. The chromium layer bared by the development process in the unexposed areas is dissolved away with one of the conventional etching solutions for use with chromium layers. The parts of the coating retained in the exposed areas of the original layer are now removed with an organic solvent and the copper image areas are inked up in the usual manner by wiping over with greasy ink. The trimetal plate now may be used for printing.

The compound of Formula 8 is prepared by condensing equimolecular quantities of 4-azido benzaldehyde and 5-amino-2-aceto amino anisole in warm ethanol. The melting point of the compound is 133–135° C., its absorption maximum, λmax., is 356 nm.

EXAMPLE 4

1 part by weight of the compound of Formula 18 above, 1 part by weight of meta cresol-formaldehyde novolak, 1 part by weight of a copolymer resin of polyvinyl acetate and crotonic acid, and 0.2 part by weight of the phthalocyanine dyestuff "Zapon Fast Blue HFL" (Color Index No. 74,350) are dissolved in 100 parts by volume of glycol methylether acetate. A cleaned zinc plate is coated with this solution and then dried. The coated zinc plate is exposed under a master and after removal of the unexposed parts of the layer with a solution consisting of 80 percent of a trisodium phosphate solution (10%) and 20 percent of glycol monomethylether, an image is produced which may be processed into a relief printing plate by etching with nitric acid or, preferably, by etching in a one-step etching machine with the addition of a protective agent for the side walls.

To improve the adhesion of the layer during the one-step etching process and during after-etching by hand to correct the tone values, the plate may be burned-in, at temperatures ranging from 100 to 200° C., between development and etching. It is also possible to burn the plate in after exposure, in which case it is developed with a 1.5 percent potassium hydroxide solution mixed with 10 to 20 percent of ethyleneglycol monoethylether.

The compound of Formula 18 is prepared by mixing equimolecular quantities of 5-azido-salicylic aldehyde and anthranilic acid in the form of concentrated solutions in warm ethanol. The condensation product thus obtained has a melting point of 147–148° C., and an absorption maximum, λmax., of 341 nm.

EXAMPLE 5

1 part by weight of the compound of Formula 9 above, 1 part by weight of meta cresol-formaldehyde novolak, 1 part by weight of a copolymer of styrene and maleic anhydride, and 0.1 part by weight of a dyestuff, e.g. Methyl Violet, are dissolved in 10 parts by volume of a mixture of glycol monomethylether and butyl acetate. A support consisting of a plastic plate or foil with a copper layer thereon is coated with this solution and the solution thus applied to the copper layer is then dried. The dried layer is exposed under a negative master showing a wiring diagram and the unexposed parts of the layer are removed from the support by wiping with an approximately 15 percent solution of trisodium phosphate. The bared copper is then etched with an iron-(III)-chloride solution or with an ammonium persulfate solution, so that a so-called printed circuit is obtained.

The compound of Formula 9 is prepared by condensing 4-azidobenzaldehyde and 4-nitro-aniline in ethanol. After recrystallization from ethanol, the compound has a melting point of 114–115° C., and an absorption maximum, λmax ., of 350 nm.

EXAMPLE 6

1 part by weight of the compound of Formula 25 above 1 part by weight of a condensation product of meta cresol-formaldehyde novolak and monochloroacetic acid, 1 part by weight of a styrene-maleic anhydride copolymer, and 0.2 part by weight of a soluble dyestuff, e.g. Sudan Red, are dissolved in 100 parts by volume of a 4:1 mixture of glycol monoethylether and dimethylformamide. A copper plate or a copper cylinder is coated with this solution and then dried.

The light-sensitive coated support is exposed under a screen positive and then developed with a solvent mixture consisting of 95 percent of glycol and 5 percent of diglycol monoethylether. The bared areas of the copper support may be deep-etched with $FeCl_3$ solution in the normal manner. A printing plate for half-tone intaglio printing is thus obtained.

The compound of Formula 25 is prepared by condensing equimolecular quantities of 4-azido benzaldehyde and 2,5-diamino-p-xylene in hot absolute ethanol. The melting point of the compound is 168–169° C., its absorption maximum, λmax., 380 nm.

EXAMPLE 7

1 part by weight of a mixture of equal quantities of the compounds of Formula 23 and Formula 27 above, 2 parts by weight of a styrenemaleic anhydride copolymer, and 1 part by weight of a condensation product of meta cresol-formaldehyde-novolak and monochloroacetic acid are dissolved in 100 parts by volume of dimethyl formamide. A glass plate which has been carefully cleaned is coated with this solution and the coated layer is then dried. The dried layer is exposed under a positive master and developed with a solvent mixture made up of 85 percent of glycol and 15 percent of triglycol. In the areas which were not struck by light, the layer is removed from the glass support. The bared areas of the glass support, i.e. the areas corresponding to the image areas of the positive master, are now deep-etched by means of an aqueous solution of hydrofluoric acid and then may be inked up after the etching process.

The compound of Formula 23 is prepared by condensing 2 moles of 4-azido-benzaldehyde and 1 mole of p-phenylene diamine. The condensation product is recrystallized from dioxane. The compound of Formula 27 is prepared by condensing 2 moles of 4-azido benzaldehyde and 1 mole of 3,4-diamino toluene in hot absolute ethanol. The compound of Formula 23 has a melting point of 166–167° C. and an absorption maximum, λ max., of 370 nm. The compound of Formula 27 has a melting point of 139–140° C. and an absorption maximum, λ max., of 415 nm.

EXAMPLE 8

A cleaned plate of refined steel is coated in the normal manner with the light-sensitive solution described in Example 3, which contains the compound of Formula 8 above. The coated layer is then dried and after drying, the plate is exposed under a positive master with text written thereon and then developed as described in Example 3. In a bath containing either an acid solution of salts or dilute acids as the electrolytic solution, the image of the writing on the original is deep-etched either anodically by means of direct current or electrochemically by means of alternating current. Graphic intelligence may be permanently fixed by this method instead of engraving or embossing.

EXAMPLE 9

1 part by weight of the compound of Formula 21 above, 1 part by weight of a condensation product of meta cresol-formaldehyde novolak and monochloroacetic acid, and 2 parts by weight of a styrene-maleic anhydride copolymer resin are dissolved in isopropanol. The solution is coated onto a roughened aluminum foil and then dried. A planographic printing plate may be prepared from the thus sensitized foil by exposure under a negative master and wiping of the exposed layer with a 5 percent trisodium phosphate solution in order to remove the portions of the layer not struck by light during exposure under the master.

The compound of Formula 21 is prepared by condensing 2-chloro-4-azido-benzaldehyde with 4-amino benzoic acid in ethanol. The melting point of the compound is 180–185° C.

Results of similar quality are obtained by replacing the light-sensitive compounds employed in the above examples by other compounds corresponding to the general and specific formulae given above.

It will be obvious to those skilled in the art that many modifications may be made within the scope of the present invention without departing from the spirit thereof, and the invention includes all such modifications.

What is claimed is:

1. An azido azomethine having one of the following formulae

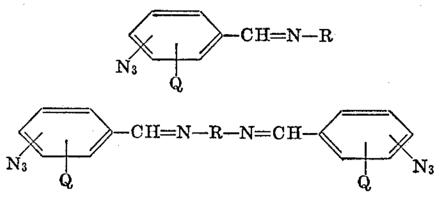

in which Q is selected from the group consisting of hydrogen, hydroxyl, alkyl, alkoxy, dialkylamino and azido groups, R is selected from the group consisting of isocyclic aromatic and heterocyclic aromatic groups; and $N_3$ is in meta or para position to the —CH=N—R group.

2. An azido azomethine having the formula

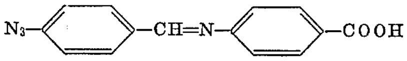

3. An azido azomethine having the formula

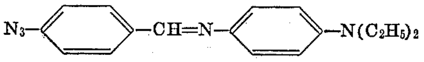

4. An azido azomethine having the formula

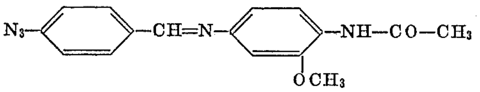

5. An azido azomethine having the formula

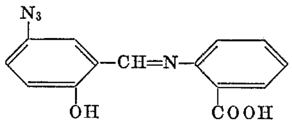

6. An azido azomethine having the formula

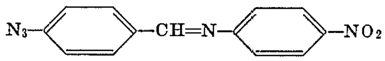

7. An azido azomethine having the formula

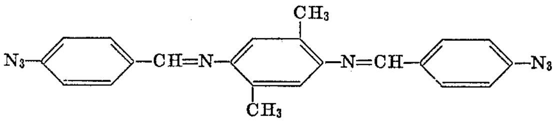

8. An azido azomethine having the formula

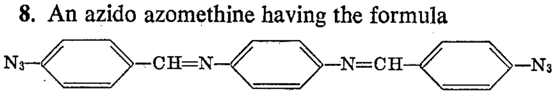

9. An azido azomethine having the formula

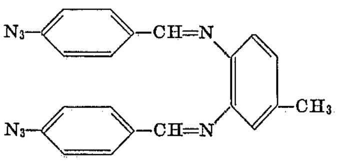

10. An azido azomethine having the formula

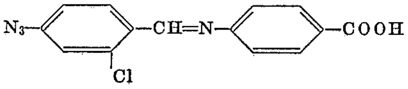

References Cited

UNITED STATES PATENTS

| | | | |
|---|---|---|---|
| 3,455,914 | 7/1969 | Ruckert | 96—33 |
| 3,061,435 | 10/1962 | Tomanek | 260—349 |
| 3,143,423 | 8/1964 | Reynolds et al. | 260—349 |

NORMAN G. TORCHIN, Primary Examiner

J. E. CALLAGHAN, Assistant Examiner

U.S. Cl. X.R.

260—240.1, 349; 96—33, 91